United States Patent
Breunig

(10) Patent No.: US 7,102,554 B2
(45) Date of Patent: Sep. 5, 2006

(54) METHOD FOR SETTING AN A/D CONVERTER

(75) Inventor: Achim Breunig, Seltz (FR)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/089,505

(22) Filed: Mar. 24, 2005

(65) Prior Publication Data

US 2005/0212971 A1    Sep. 29, 2005

(30) Foreign Application Priority Data

Mar. 24, 2004 (DE) .................. 10 2004 014 488

(51) Int. Cl.
*H03M 1/06* (2006.01)

(52) U.S. Cl. ..................... 341/118; 341/155

(58) Field of Classification Search ............... 341/118, 341/119, 120, 121, 155; 348/207, 222, 229, 348/362
See application file for complete search history.

(56) References Cited

U.S. PATENT DOCUMENTS 5,387,930 A * 2/1995 Toh .................. 348/222.1
2004/0184643 A1* 9/2004 Stantchev et al. ......... 382/128

* cited by examiner

*Primary Examiner*—Brian Young

(57) ABSTRACT

There is proposed a method for setting an A/D converter (2) to which analog image signal (5) can be fed from which the A/D converter (2) generates a digitized image signal (3). To set an offset point of the A/D converter (2),
the look-up table (LUT) is loaded with values which produce a first item of image information if the offset point is correctly set,
the A/D converter (2) is fed an analog image signal (5) with predefinable video levels whose digitized values correspond to the first item of image information if the offset point of the A/D converter (2) is correctly set,
the offset point is adjusted until the first item of image information is displayed.

16 Claims, 4 Drawing Sheets

FIG 4b

| Input values | Output values |
|---|---|
| 0 | 0 |
| 1 | 0 |
| 2 | 0 |
| ••• | ••• |
| 64 | 0 |
| ••• | ••• |
| 128 | 0 |
| ••• | ••• |
| 254 | 255 |
| 255 | 0 |

| Input values | Output values |
|---|---|
| 0 | 0 |
| 1 | 255 |
| 2 | 0 |
| ••• | ••• |
| 64 | 0 |
| ••• | ••• |
| 128 | 0 |
| ••• | ••• |
| 254 | 0 |
| 255 | 0 |

EV1

METHOD FOR SETTING AN A/D CONVERTER

CROSS REFERENCE TO RELATED APPLICATIONS

This application claims priority to the German application No. 10 2004 014 488.5, filed Mar. 24, 2004 and which is incorporated by reference herein in its entirety.

FIELD OF INVENTION

The invention relates to a method for setting an A/D converter

BACKGROUND OF INVENTION

Usually during factory setting the basic brightness of a monochrome panel is set via the so-called offset of an A/D converter in such a way that a video step 0 is generated from the lowest video level of 0 volts of an analog image signal when a black image is displayed on the panel. If the brightness is set too low, this will result in an excessively dark image, as it is only, for example, at a video level of 0.1 volts at the A/D converter input that a video step greater than 0 is produced at its output, thereby causing image information and levels of grey to be lost. On the other hand, if the brightness is set too low, an excessively light image will result. In this case, for example, at a video level of 0 volts a video step 32 is generated instead of a video step 0, likewise causing image information and levels of grey to be lost.

Also during factory setting the contrast of the monochrome panel is set via the gain of the A/D converter in such a way that a maximum video step is generated from the highest video level, e.g. a video level of 0.7 volts, of an analog image signal when a white image is displayed on the panel. Should, for example, an 8-bit A/D converter be provided, the gain is set in such a way that this A/D converter generates a video step 255 from the maximum video level 0.7 volts. If the contrast is set too low, this produces an excessively low-contrast image and levels of grey are lost, as the A/D converter does not produce the maximum possible video step from a maximum video level. On the other hand, if the contrast is set too high, this causes the A/D converter to output the maximum video step even before the maximum video level is attained, causing image information to be lost.

SUMMARY OF THE INVENTION

The object of the present invention is to specify a method of the abovementioned kind, whereby the setting of the A/D converter is simplified.

This object is achieved by the claims.

To set the offset point of the A/D converter and therefore the basic brightness of the panel, it is advantageous to use a known per se look-up table which in a normal operating mode, e.g. when the panel is being used in the medical field, corrects or optimizes the shape of the image reproduction characteristic. This characteristic specifies how the digitized signal is converted into an optical signal, consisting of luminance and chromaticity. The look-up table consists of three different tables: one for red, one for green and one for blue. During normal operation, correction is performed as follows: a graphics processor required to control the panel ascertains from the look-up table which output value the processor is to apply to the panels instead of the currently incoming video step of the image signal. This causes the image data to be applied to the panels to be varied in accordance with an optimum image reproduction characteristic.

The first setting video step is expediently selected such that a correctly set offset point is distinguished from an incorrectly set offset point of the A/D converter by clear optical differentiation. In a practical example of the invention, a very good optical differentiation is achieved if video step 1 is selected as the first setting video step to which a video step 255 is assigned as the first output value.

Although it is possible to assign the output value 255 to a video step 2, 3 or 4, for example, this is at the expense of the accuracy of the offset point setting. The farther the first setting point is from video step 1, the more inaccurately the offset point is set.

In an embodiment of the invention, provision is made for additionally setting the gain of the A/D converter and therefore the contrast of the panel.

The second setting video step is expediently selected such that a correctly set gain is distinguished from an incorrectly set gain of the A/D converter by clear optical differentiation. In a practical exemplary embodiment of the invention, the second largest video step is selected as the second setting video step to which the maximum video step is assigned as the second output value. Although it is possible to assign this second output value to the third, fourth or fifth video step, for example, this is at the expense of the accuracy of the gain setting. The farther the second setting point is from the second largest video step, the more inaccurately the gain is set.

In further embodiments of the invention, the second output values are selected in such a way that that a precisely set offset point or a precisely set gain of the A/D converter is detected by displaying a white image on a monochrome panel or displaying a red, blue or green image on a color panel. The setting of the offset or gain of the A/D converter can be automated by using a suitable sensor to detect variations in the luminances of the image displayed on the panel. If, for example, the luminance of the white image on the monochrome panel is sensed, this will indicate the precisely set offset or the precisely set gain of the A/D converter.

The invention, its embodiments and advantages will now be explained in greater detail with reference to the accompanying drawings illustrating an exemplary embodiment of the invention,

BRIEF DESCRIPTION OF THE DRAWINGS

FIGS. 2 and 3 show digitized voltage values as a function of analog video voltages and FIG. 4 shows a look-up table for a monochrome panel.

DETAILED DESCRIPTION OF INVENTION

Figure 1:
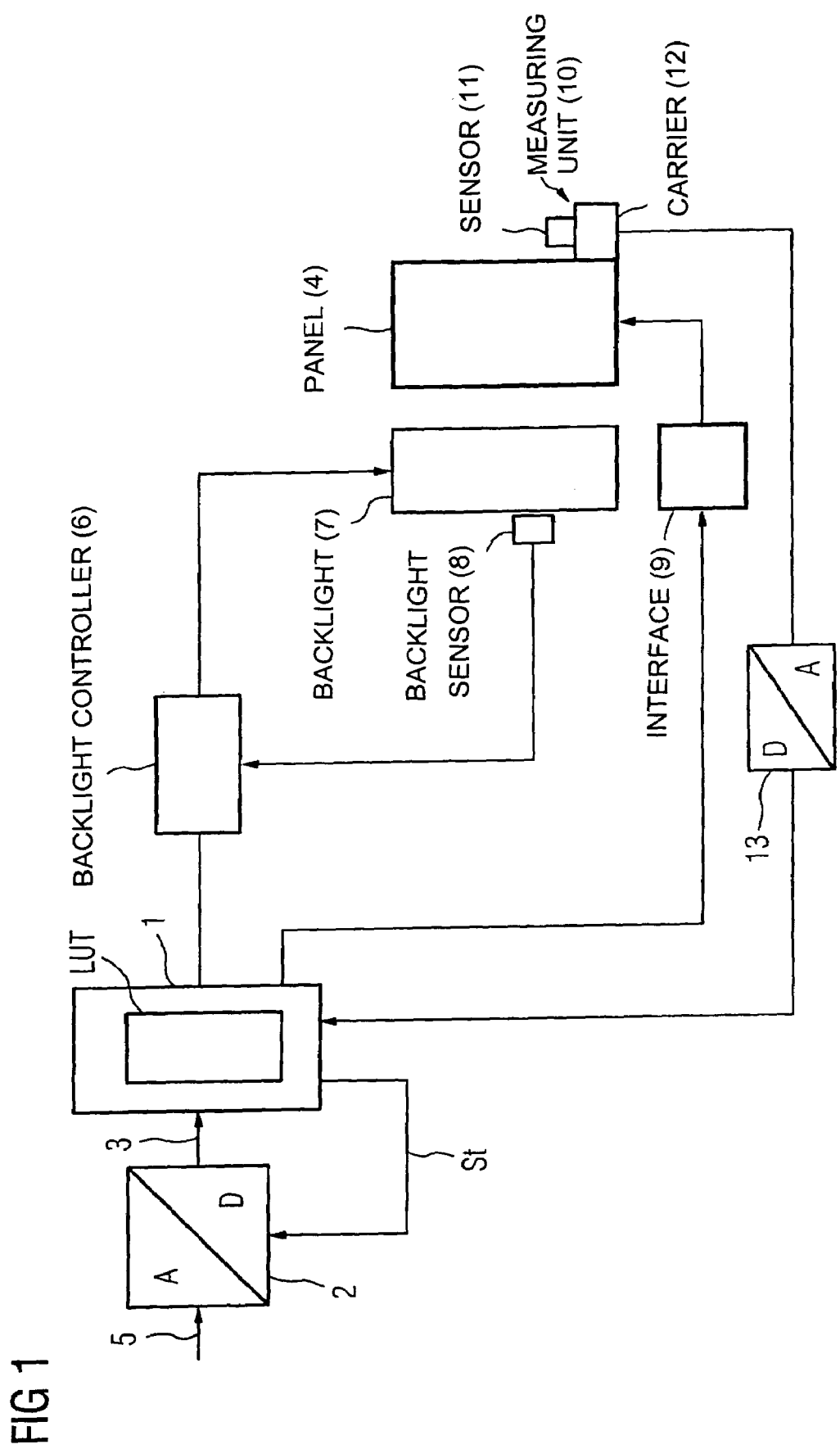
FIG. 1 shows an arrangement for setting the offset and/or gain of an A/D converter.

In FIG. 1, reference numeral 1 denotes a graphics processor to which a digitized image signal 3 is fed by an 8-bit A/D converter 2 to display an image on an LCD panel 4 of a flat screen device. It is assumed that the digitized image signal 3 contains video steps from 0 to 255 which the A/D converter 2 generates from an analog image signal 5 in a voltage range of 0 to 0.7 volts. These video steps 0 to 255 are fed to a look-up table LUT which during normal operation evaluates these video steps and optimizes them in respect of the shape of an image reproduction characteristic, e.g. a characteristic compliant with the DICOM or CIELAB standard. The graphics processor 1 drives a backlight controller 6 which adjusts the luminance of a backlight 7 in order to achieve essentially constant luminance conditions. For this purpose there is provided a backlight sensor 8 which detects the luminance of the backlight 7 which the backlight controller 6 adjusts to a nominal luminance. Via a suitable interface 9, the graphics processor 1 transmits the digital image signal to the panel 4, causing the image information to be visually displayed.

Figure 2:
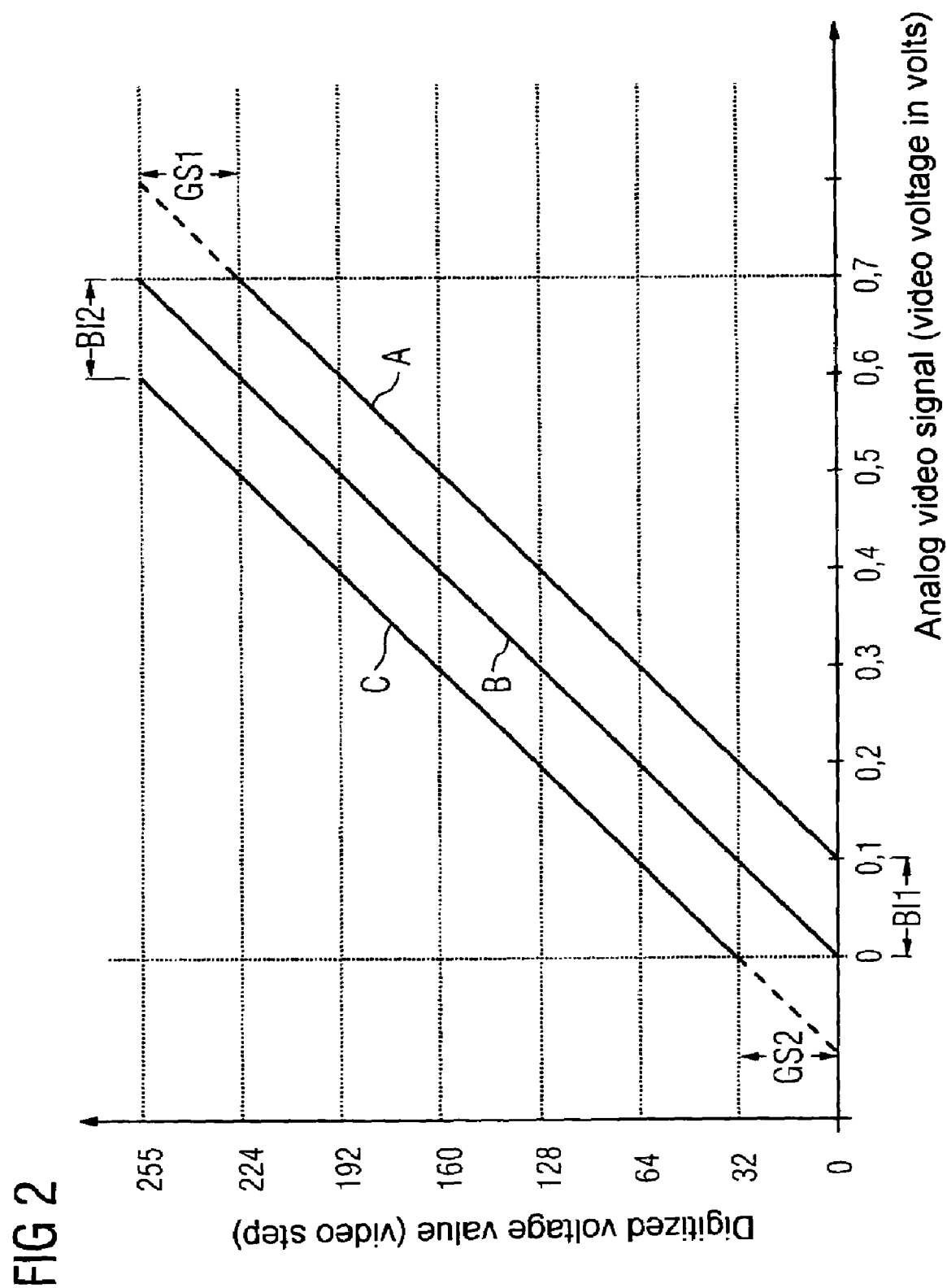

Reference will now be made to FIG. 2 which shows digitized voltage values (video steps) at the output of an 8-bit A/D converter as a function of analog video voltages (video signal) at its input. A first case (straight line A) shows an A/D converter offset set too low and therefore a brightness set too low, video steps greater than 0 only being present at the A/D converter output when a video voltage of 0.1 volts or more is present at the A/D converter input. In comparison to a correctly set brightness (straight line B), this results in image information BI1 and levels of grey GS1 being lost. In a second case (straight line C), the brightness (offset point) is set too high, a video step 32 being present at the output of the A/D converter even when a video voltage of 0 volts is applied to the input of the A/D converter. In comparison to a correctly set brightness (straight line B), this likewise results in image information BI2 and levels of grey GS2 being lost.

Figure 3:
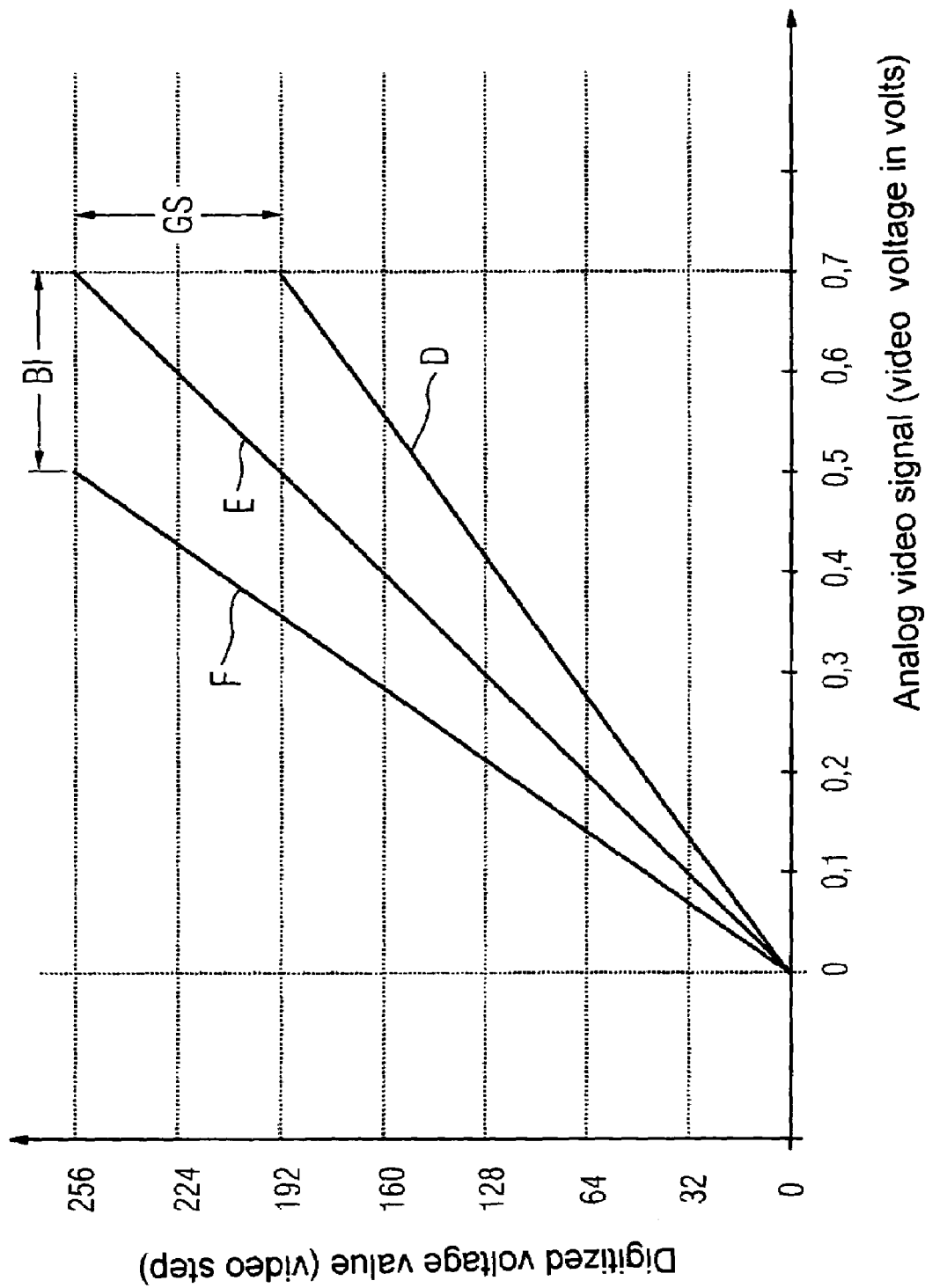

FIG. 3 likewise shows digitized voltage values at the output of an 8-bit A/D converter as a function of video voltages at its input. A first case (straight line D) shows an A/D converter gain set too low and therefore a contrast set too low, as the A/D converter only generates a video step 192 at its output from a maximum video input voltage of 0.7 volts. In comparison to a correctly set contrast (straight line E), this results in levels of grey GS being lost. In a second case (straight line F), the contrast is set too high, causing the A/D converter to generate a maximum video step 255 at the output from a video voltage of as low as 0.5 volts at the input. In comparison to a correctly set contrast (straight line E), this results in image information BI being lost.

In order to set the offset of the A/D converter (FIG. 1) correctly, during an offset setting phase the look-up table LUT is first loaded with values, a first setting video step EV1 above the smallest video step 0 being assigned a first output value, and video steps different from said first setting video step EV1 each being assigned an output value different from said first output value. In this connection reference is made to FIG. 4 which shows a look-up table for controlling a monochrome panel. In this example an input video step 1 is assigned an output video step 255 which represents a first setting video step EV1 (FIG. 4a), whereas the remaining input video steps 0, 2, . . . , 255 are each assigned an output video step 0. This means that input video step 1 is assigned a white image, whereas the remaining video steps are assigned a black image. When the look-up table has been loaded with the values, the A/D converter 2 (FIG. 1) is fed an analog test image from whose video levels the A/D converter 2 in each case generates a video step 1 for the eventuality that the offset of the A/D converter is already correctly set. If this is the case, the graphics processor 1 transmits an output video step 255 to the panel 4 according to the loading of the look-up table LUT for said input video step 1, causing a white image to be displayed on said panel 4. Should the A/D converter 2 not digitize the video levels of the test image to produce a video step 1 because of an incorrectly set offset, the graphics processor 1 feeds video steps 0 to the panel 4, causing a black image to be displayed on the panel 4.

It is easy for a viewer of the panel 4 to perform the setting on the basis of the white image in the event of a correctly set offset or the black image in the event of an incorrectly set offset. For example, by means of a switch accessible to the viewer, the latter can progressively vary the offset until a white image is displayed on the panel 4. This white image indicates to the viewer that the offset is set correctly. Setting can also be automated e.g. by the graphics processor 1 progressively increasing or reducing the offset of the A/D converter 2 via a control line, the luminance of the image displayed on the panel 4 being detected by a sensor 11 disposed on a sensor carrier 12 of a measuring unit 10 during these changes. The detected luminance is transmitted by the measuring unit 10 to the graphics processor via an A/D converter 13. A correctly set offset point is detected by the graphics processor 1 on the basis of a change in luminance caused by the changeover from a black image to a white image.

The gain of the A/D converter 2 is set in a similar manner to the setting of the offset point. During an amplifier setting phase, the look-up table LUT is first loaded with values, a second setting video step EV2 below the maximum video step 255 being assigned a second output value, and video steps different from said second setting video step EV2 each being assigned an output value different from said second output value. In this example an input video step 254 is assigned an output video step 255 which represents a second setting video step EV2 (FIG. 4b), whereas the remaining input video steps 0 to 253 and 255 are each assigned an output video step 0. This means that input video step 254 is assigned a white image, whereas the remaining video steps are assigned a black image. When the look-up table has been loaded with the values, the A/D converter 2 (FIG. 1) is fed an analog test image from whose video levels the A/D converter 2 in each case generates a video step 254 for the eventuality that the gain of the A/D converter is already correctly set. If this is the case, the graphics processor 1 transmits an output video step 255 to the panel 4 according to the loading of the look-up table LUT for said input video step 254, causing a white image to be displayed on said panel 4. Should the A/D converter 2 not digitize the video levels of the test image to produce a video step 254 because of an incorrectly set gain, the graphics processor 1 feeds video steps 0 to the panel 4, causing a black image to be displayed on the panel 4.

The gain is set in the same way as the offset. It is easy for the viewer of the panel 4 to perform the setting or for this setting to be automated on the basis of the white image in the event of correctly set gain or the black image in the event of incorrectly set gain.

The invention claimed is:

1. A method for setting an A/D converter which can be fed an analog image signal from which the A/D converter generates a digitized image signal, wherein an offset point of the A/D converter can be set in such a way that the A/D converter generates a minimum video step of the digitized image signal from a minimum video level of the analog image signal, wherein an amplification of the A/D converter can be set in such a way that the A/D converter generates a maximum video step of the digitized image signal from a maximum video level of the analog image signal, wherein a look-up table evaluates the digitized image signal and transmits output values assigned to the video steps to a panel via an interface, causing image information to be visually displayed, the method comprising:

setting the offset point of the A/D converter by loading the look-up table with values which produce a first item of image information if the offset point is correctly set and which produce a second item of image information different from the first item if the offset point is incorrectly set;

feeding the A/D converter an analog image signal with predefinable video levels whose digitized values correspond to the first item of image information if the offset point of the A/D converter is correctly set; and adjusting the offset point until the first item of image information is displayed.

2. A method for setting an A/D converter which can be fed an analog image signal from which the A/D converter generates a digitized image signal, wherein an offset point of the A/D converter can be set in such a way that the A/D converter generates a minimum video step of the digitized image signal from a minimum video level of the analog image signal, wherein an amplification of the A/D converter can be set in such a way that the A/D converter generates a maximum video step of the digitized image signal from a maximum video level of the analog image signal, wherein a look-up table evaluates the digitized image signal and transmits output values assigned to the video steps to a panel via an interface, causing image information to be visually displayed, the method comprising:

setting the offset point of the A/D converter by loading the look-up table with values which produce a first item of image information if the offset point is correctly set;

feeding the A/D converter an analog image signal with predefinable video levels whose digitized values correspond to the first item of image information if the offset point of the AD converter is correctly set; and adjusting the offset point until the first item of image information is displayed;

wherein the look-up table is loaded with values which assign a first output value to a first setting video step and assign an output value different from said first output value to video steps different from said first setting video step in each case, said first setting video step corresponding to the minimum video step or a video step above the minimum video step, and wherein the A/D converter is fed an analog image signal with predefinable video levels whose digitized values in each case correspond to the first setting video step if the offset point of the A/D converter is correctly set.

3. A method for setting an A/D converter which can be fed an analog image signal from which the A/D converter generates a digitized image signal, wherein an offset point of the A/D converter can be set in such a way that the A/D converter generates a minimum video step of the digitized image signal from a minimum video level of the analog image signal, wherein an amplification of the A/D converter can be set in such a way that the A/D converter generates a maximum video step of the digitized image signal from a maximum video level of the analog image signal, wherein a look-up table evaluates the digitized image signal and transmits output values assigned to the video steps to a panel via an interface, causing image information to be visually displayed, the method comprising:

setting the offset point of the A/D converter by loading the look-up table with values which produce a first item of image information if the offset point is correctly set;

feeding the A/D converter an analog image signal with predefinable video levels whose digitized values correspond to the first item of image information if the offset point of the A/D converter is correctly set; and adjusting the offset point until the first item of image information is displayed, wherein, to set the amplification of the A/D converter, the look-up table is loaded with values which produce a second item of image information if the amplification is correctly set, the A/D converter is fed an analog image signal with predefinable video levels whose digitized values correspond to the second item of image information if the amplification of the A/D converter is correctly set, and the amplification of the A/D converter is adjusted until the second item of image information is displayed.

4. The method according to claim 2, wherein, to set the amplification of the A/D converter, the look-up table is loaded with values which produce a second item of image information if the amplification is correctly set, the A/D converter is fed an analog image signal with predefinable video levels whose digitized values correspond to the second item of image information if the amplification of the A/D converter is correctly set, and the amplification of the A/D converter is adjusted until the second item of image information is displayed.

5. The method according to claim 3, wherein, to set the amplification of the A/D converter, the look-up table is loaded with values which assign a second output value to a second setting video step and assign an output value different from said second output value to video steps different from said second setting video step in each case, said second setting video step corresponding to the maximum video step or a video step below the maximum video step, and the A/D converter is fed an analog image signal with predefinable video levels whose digitized values in each case correspond to the second setting video step if the A/D converter is correctly set.

6. The method according to claim 4, wherein, to set the amplification of the A/D converter, the look-up table is loaded with values which assign a second output value to a second setting video step and assign an output value different from said second output value to video steps different from said second setting video step in each case, said second setting video step corresponding to the maximum video step or a video step below the maximum video step, and the A/D converter is fed an analog image signal with predefinable video levels whose digitized values in each case correspond to the second setting video step if the A/D converter is correctly set.

7. The method according to claim 5, wherein, if the panel is a color panel, the look-up table has a table for each of the colors red, green and blue, wherein for each color a first and a second setting video step, and a first and a second output value is provided.

8. The method according to claim 6, wherein, if the panel is a color panel, the look-up table has a table for each of the colors red, green and blue, wherein for each color a first and a second setting video step, and a first and a second output value is provided.

9. The method according to claim 7, wherein the first and second output values are identical for each color and produce a red, blue or green image on the panel.

10. The method according to claim 8, wherein the first and second output values are identical for each color and produce a red, blue or green image on the panel.

11. The method according to claim 5, wherein, if the panel is be a monochrome panel, the first and second output values are identical and produce in each case a white image on the panel.

12. The method according to claim 6, wherein, if the panel is be a monochrome panel, the first and second output values are identical and produce in each case a white image on the panel.

13. The method according to claim 9, wherein output values different from the first and second output value produce a black image on the panel.

14. The method according to claim 10, wherein output values different from the first and second output value produce a black image on the panel.

15. The method according to claim 11, wherein output values different from the first and second output value produce a black image on the panel.

16. The method according to claim 12, wherein output values different from the first and second output value produce a black image on the panel.

* * * * *